US011468966B2

(12) United States Patent
Yen

(10) Patent No.: US 11,468,966 B2
(45) Date of Patent: Oct. 11, 2022

(54) MEMORY DEVICE WITH POST PACKAGE REPAIR FUNCTION AND METHOD FOR OPERATING THE SAME

(71) Applicant: NANYA TECHNOLOGY CORPORATION, New Taipei (TW)

(72) Inventor: Nung Yen, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 260 days.

(21) Appl. No.: 16/879,944

(22) Filed: May 21, 2020

(65) Prior Publication Data

US 2021/0366568 A1 Nov. 25, 2021

(51) Int. Cl.
*G11C 29/44* (2006.01)
*G11C 29/00* (2006.01)
*G11C 11/4091* (2006.01)
*G11C 11/408* (2006.01)

(52) U.S. Cl.
CPC .......... *G11C 29/88* (2013.01); *G11C 11/4087* (2013.01); *G11C 11/4091* (2013.01); *G11C 29/44* (2013.01); *G11C 29/785* (2013.01); *G11C 29/808* (2013.01)

(58) Field of Classification Search
CPC ....... G11C 29/88; G11C 29/44; G11C 29/785; G11C 29/808
USPC ........................................................ 365/200
See application file for complete search history.

(56) References Cited

U.S. PATENT DOCUMENTS

| 3,940,740 | A | 2/1976 | Coontz | |
| 6,373,758 | B1* | 4/2002 | Hughes | G11C 29/72 365/201 |
| 6,853,591 | B2* | 2/2005 | Schreck | G11C 29/50016 365/207 |
| 10,832,791 | B2* | 11/2020 | Wilson | G11C 7/106 |
| 10,909,011 | B2* | 2/2021 | Wilson | G11C 17/18 |
| 2015/0009742 | A1 | 1/2015 | Kang et al. | |

(Continued)

OTHER PUBLICATIONS

Office Action dated Sep. 2, 2021 in TW Application No. 110116357, 3 pages.

*Primary Examiner* — Son L Mai
(74) *Attorney, Agent, or Firm* — Muncy, Geissler, Olds & Lowe, P.C.

(57) ABSTRACT

The present disclosure provides an operation method related to a post package repair (PPR) function in a dynamic random access memory (DRAM) device. The method for operating a post package repair (PPR) function of a memory device is disclosed. The method includes providing a memory bank, which includes a memory array and a sense amplifier adjacent to the memory array, wherein the memory array comprises at least one defective row and at least one associated row, and the at least one associated row is electrically connected to the sense amplifier by a plurality of bit lines. The method also includes arranging a redundant row adjacent to the memory array, wherein the redundant row is electrically connected to the sense amplifier by the plurality of bit lines. The method also includes activating the at least one associated row to transmit data in the at least one associated row to the sense amplifier, latching the data in the sense amplifier; activating the redundant row, and transmitting the data from the sense amplifier to the redundant row.

19 Claims, 19 Drawing Sheets

(56) References Cited

U.S. PATENT DOCUMENTS

| | | |
|---|---|---|
| 2019/0214071 A1 | 7/2019 | Hedden |
| 2020/0117558 A1 | 4/2020 | Wilson |
| 2020/0151070 A1 | 5/2020 | Lee et al. |
| 2022/0076731 A1* | 3/2022 | Rooney ............... G11C 11/4087 |

* cited by examiner

US 11,468,966 B2

MEMORY DEVICE WITH POST PACKAGE REPAIR FUNCTION AND METHOD FOR OPERATING THE SAME

TECHNICAL FIELD

The present disclosure relates generally to an operation method of a memory device. More particularly, the present disclosure provides an operation method related to a post package repair (PPR) function in a dynamic random access memory (DRAM) device.

DISCUSSION OF THE BACKGROUND

As the density of memory increases, memory cells of a memory device become more complex and more prone to defects. The defects may cause device errors and/or failures. In some cases, memory cells are normal before the memory device is packaged. In some cases, failures can occur after the memory device is packaged.

In an advanced memory, such as double-data-rate RAM version 4 (DDR4), a so-called post package repair (PPR) function may be included. The PPR function enables a compatible memory controller to reassign accesses from a defective row of a memory module to a redundant row of the memory module that is normal.

Although the PPR function can make a memory device effective without a need to disassemble the memory device, the repair process takes much time. Therefore, there is a need to improve the PPR function in order to improve the repair efficiency.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a method for operating a post package repair function of a memory device. The method comprises: providing a memory bank, which comprises a memory array and a sense amplifier adjacent to the memory array, wherein the memory array comprises at least one defective row and at least one associated row, and the at least one associated row is electrically connected to the sense amplifier by a plurality of bit lines; arranging a redundant row adjacent to the memory array, wherein the redundant row is electrically connected to the sense amplifier by the plurality of bit lines; activating the at least one associated row to transmit data in the at least one associated row to the sense amplifier; latching the data in the sense amplifier; activating the redundant row; and transmitting the data from the sense amplifier to the redundant row.

In some embodiments, the at least one associated row is associated with the at least one defective row according to JEDEC standards.

In some embodiments, the method further comprises arranging a row decoder adjacent to the memory array, wherein the row decoder is responsive to an associated row address in the step of activating the at least one associated row.

In some embodiments, the row decoder is responsive to a redundant row address in the step of activating the redundant row.

In some embodiments, the at least one associated row comprises multiple associated memory cells connected by an associated word line.

In some embodiments, the redundant row comprises multiple redundant memory cells connected by a redundant word line.

In some embodiments, the memory device comprises a double-data-rate fourth generation synchronous dynamic random access memory (DDR4 SDRAM) module.

In some embodiments, the memory device further comprises a PPR module.

In some embodiments, before activating the at least one associated row, the at least one defective row is deactivated.

In some embodiments, after transmitting the data from the sense amplifier to the redundant row, the data in the redundant row is identical to the data in the at least one associated row.

In some embodiments, the method further comprises determining whether the memory device is to enter a repair mode in response to receiving one or more PPR commands from a memory controller.

Another aspect of the present disclosure provides a memory device related to the operation method in a post package repair function. The memory device comprises a memory array, which comprises at least one associated row and at least one defective row; a sense amplifier, wherein the at least one associated row is electrically connected to the sense amplifier by a plurality of bit lines; and a redundant row electrically connected to the sense amplifier by the plurality of bit lines.

In some embodiments, data in the redundant row is identical to data in the at least one associated row.

In some embodiments, the at least one associated row is associated with the at least one defective row according to JEDEC standards.

In some embodiments, the memory device further comprises a row decoder located adjacent to the memory array, wherein the row decoder is responsive to an associated row address.

In some embodiments, the row decoder is responsive to a redundant row address.

In some embodiments, the at least one associated row comprises multiple associated memory cells connected by an associated word line.

In some embodiments, the redundant row comprises multiple redundant memory cells connected by a redundant word line.

In some embodiments, the memory device comprises a double-data-rate fourth generation synchronous dynamic random access memory (DDR4 SDRAM) module.

In some embodiments, the memory device further comprises a PPR module.

According to JEDEC standards, associated rows in a DDR4 SDRAM need to be backed up before a soft post package repair (SPPR) is performed. In an embodiment of the present disclosure, it is not necessary to know address information of associated rows from a CPU because no read operation is performed on the associated row. Therefore, when performing the SPPR function, data in the associated row does not need to be rewritten to the redundant row. Instead, data in the associated row can be copied directly to the redundant row because each of the associated memory cells and each of the redundant memory cells are connected to a sense amplifier through the same bit line. As a result, the operation of rewriting all the data in the associated row into the redundant row is eliminated, thereby increasing the backup efficiency of the data in the associated row.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
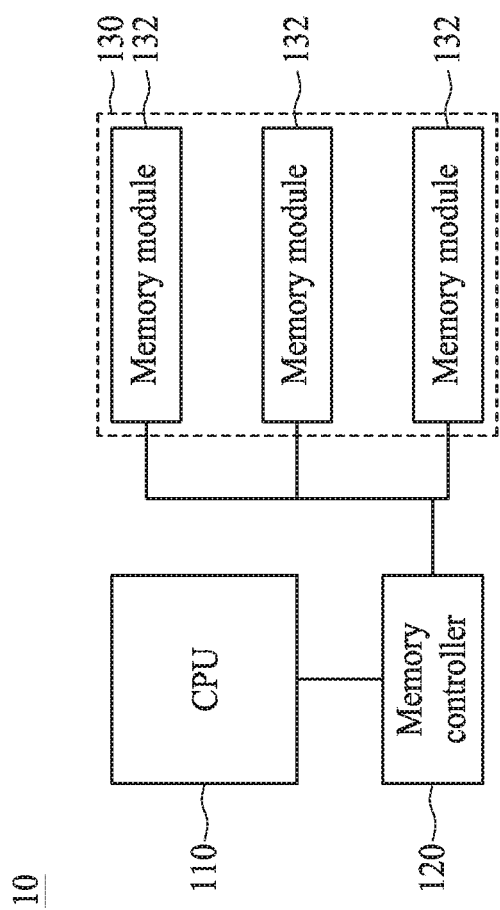
FIG. 1 is a circuit block diagram showing an electronic system, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RAM devices, such as dynamic random access memory (DRAM) devices, are typically used as the main memory in computing devices. Although the operating speed of DRAMs has improved in recent years, the speed has not reached that of a processor used to access a DRAM. In a computing device, for example, the slow access and cycle times of the DRAM give rise to system bottlenecks, which reduce the throughput of the system despite the faster operating speed of the system's processor. Therefore, there is still a great demand for faster DRAM devices.

Synchronous dynamic random-access memory (SDRAM) is a new DRAM technology, which mainly uses a synchronous clock to control the input and output signals of the memory. Computing devices comprise various types of SDRAM, such as double data rate (DDR) SDRAM. DDR is a memory transmission standard and indicates that there are two transmissions per clock cycle. Common modules for a DDR SDRAM have at least one DDR SDRAM dynamic inline memory module (DIMM). With the improvement of technology, the capacity of DDR SDRAM devices in computing devices has greatly grown. A DDR SDRAM is also retroactively called a DDRx SDRAM. This series of standards has evolved from DDR1 to DDR2, DDR3 and DDR4. Newer memory devices use relatively new standards. For example, DDR4 SDRAMs use a lower power supply voltage and greater bandwidth than DDR3 or DDR2 SDRAMs. Due to inconsistencies in voltage standards and physical interfaces, the different standards are not compatible with each other.

Figure 2:
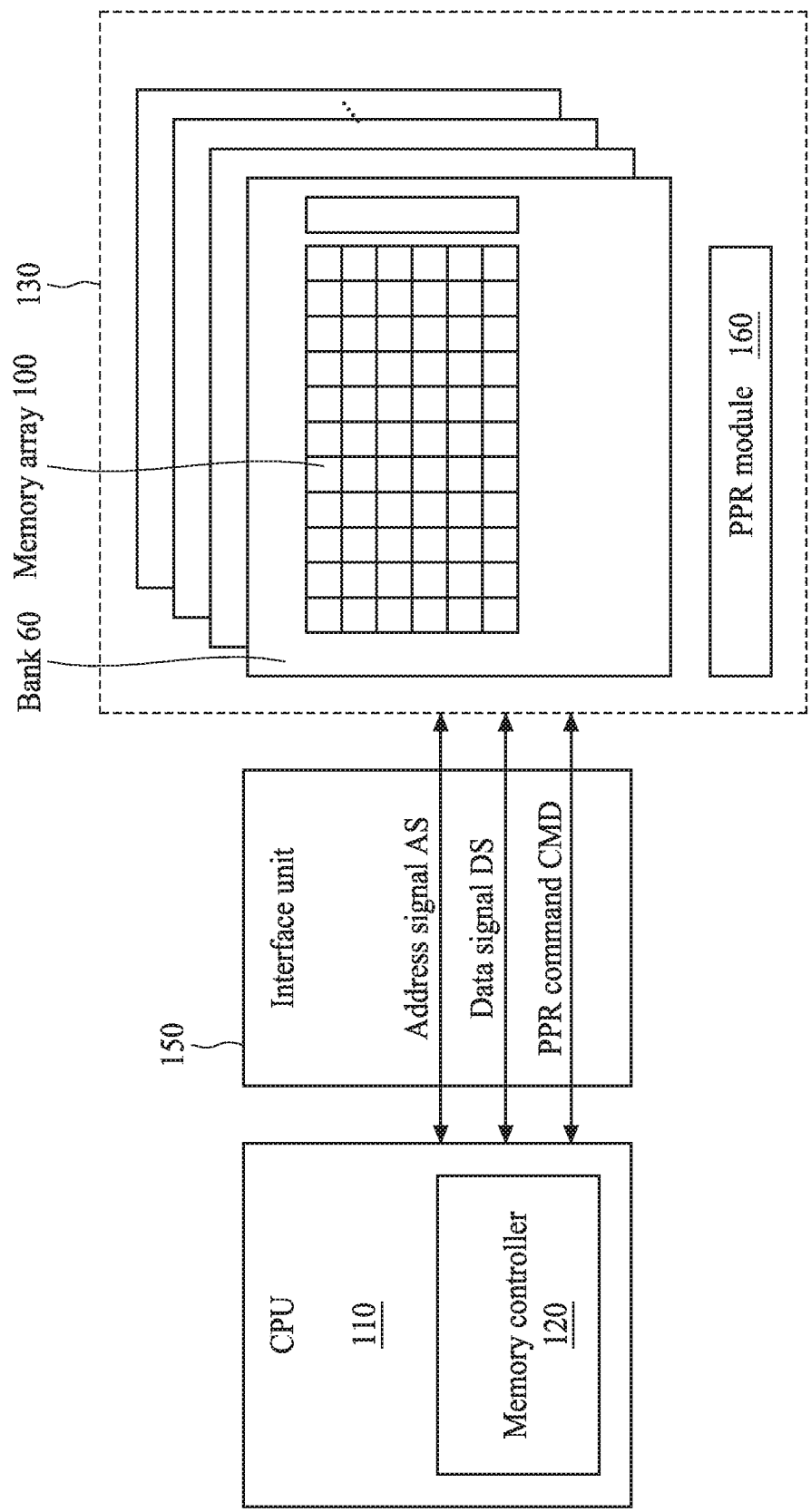
FIG. 2 is a schematic block diagram showing the electronic system, in accordance with some embodiments of the present disclosure.

FIG. 1 is a circuit block diagram showing an electronic system 10. FIG. 2 is a schematic block diagram showing the electronic system 10, in accordance with some embodiments of the present disclosure. With reference to FIG. 1, the electronic system 10 includes a central processing unit (CPU) 110, a memory controller 120 electrically connected to the CPU 110, and a memory device 130 electrically connected to the memory controller 120. The CPU 110 is a device for processing data and executing program requests from an external circuit, for example, a motherboard of a computing device. The memory controller 120 is a digital circuit that manages program requests going to and from the memory device 130, wherein the memory device 130 includes a plurality of memory modules 132. In some embodiments, the memory controller 120 is discrete from the CPU 10, as shown in FIG. 1. In alternative embodiments, the memory controller 120 is integrated in the CPU 110, as shown in FIG. 2.

Figure 3:
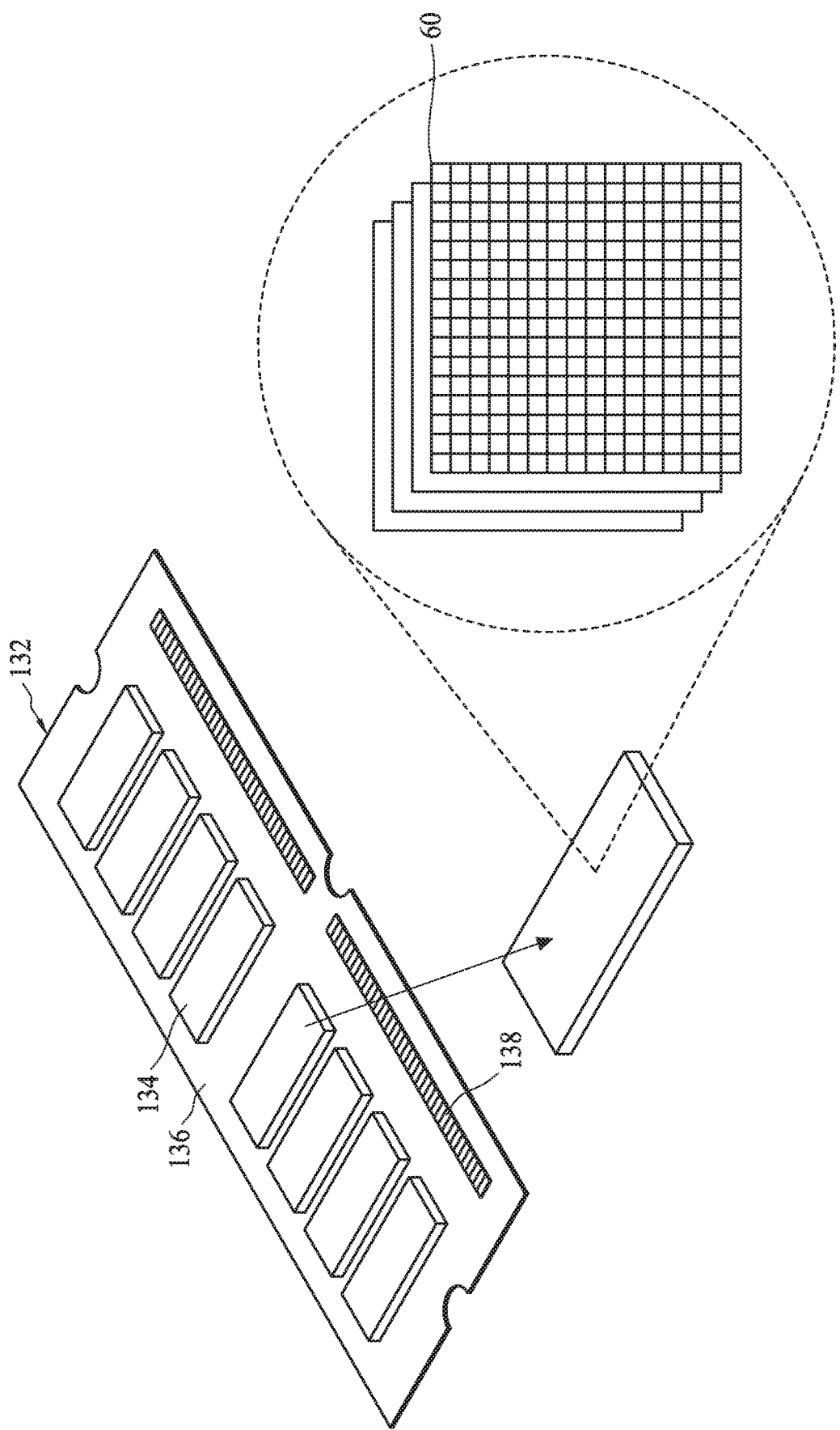
FIG. 3 is a schematic diagram showing a representative structure of a memory module, in accordance with some embodiments of the present disclosure.

FIG. 3 is a schematic diagram showing a representative structure of the memory module 132, in accordance with some embodiments of the present disclosure. With reference to FIG. 3, the memory modules 132 can be DIMMs, which take the form of multiple memory chips 134 mounted on a printed circuit board (PCB) 136. The memory chip 134 is used to store information, data or a program that is run on a computing device. Generally, the memory module 132 includes sixteen memory chips 134 mounted on both sides of the PCB 136. In other words, each side of the PCB 136 includes eight memory 1o chips 134, wherein the combination of eight memory chips 134 is generally called a rank. Therefore, the memory module 132 includes two ranks in total. As shown in FIG. 3, each memory chip 134 comprises multiple banks 60 stacked together. A bank 60 is the smallest structure visible to the memory controller 120. The combination of multiple banks 60 can be called a bank group. Each bank 60 operates independently from other banks in the bank group.

Referring back to FIG. 2, the electronic system 10 further includes an interface unit 150 associated with the memory controller 120 and the memory device 130, in contrast to the configuration of FIG. 1, which is free of an interface unit. In some embodiments, the electronic system 10 can include more or fewer elements than illustrated in FIG. 2. The memory device 130 comprises multiple banks 60 stacked together. One of the banks 60 in FIG. 2 at least comprises a memory array 100 that can perform read and write operations in response to requests received from the CPU 110 or the memory controller 120. The interface unit 150 provides an interface between the memory controller 120 and the memory device 130. More specifically, the interface unit 150 provides transmission of signals such as address signals AS, data signals DS or other commands between the memory controller 120 and the memory device 130. When a read operation or a write operation is performed in the memory device 130, the CPU 110 defines a memory address for a piece of required information in order to read data from the memory device 130 or to write data to the memory device 130. Next, the memory controller 120 determines which of the memory arrays 100 is associated with the memory address among multiple banks 60. The memory controller 120 may access a memory array 100 based on the memory address received from the CPU 110. The memory controller 120 transmits an address signal AS to access a designated memory address (a designated row and column) of the memory array 100. Therefore, the read or write operation can be performed at the designated row and column. Subsequently, the memory controller 120 may transmit a data signal DS from the memory array 100 to the CPU 110 via the interface unit 150. In an embodiment, the memory device 130 may comprise one or more memory-related modules.

Still referring to FIG. 2, the memory device 130 may further include a PPR module 160. The PPR module 160 can perform a post package repair function according to a PPR command CMD issued by the memory controller 120. The interface unit 150 may provide transmission of the PPR command CMD between the memory controller 120 and the memory device 130. In addition, whether the memory device 130 is to enter a repair mode may be determined in response to receiving one or more PPR commands CMD and/or address signals AS from the memory controller 120. In another embodiment, the post package repair function can be controlled by a controller (not shown) that is external to the memory device 130. In such embodiment, when the memory controller 120 detects an error in the memory array 100, the memory controller 120 can issue a PPR command CMD to the memory device 130. Subsequently, the memory device 130 may follow a PPR sequence to repair the error.

Figure 4:
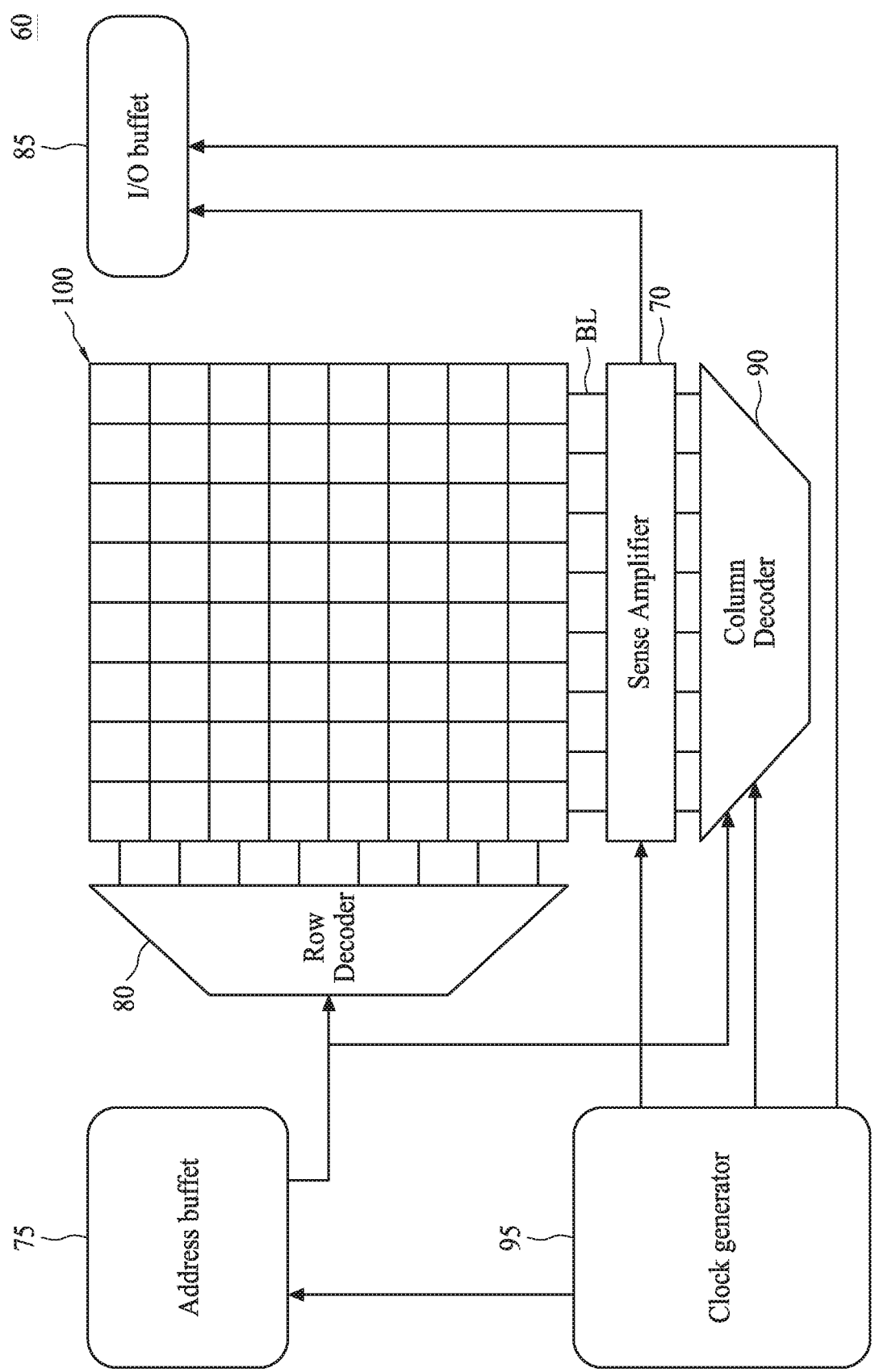
FIG. 4 is a schematic diagram showing a representative structure of a bank, in accordance with some embodiments of the present disclosure.

FIG. 4 is a schematic diagram showing a representative structure of the bank 60, in accordance with some embodiments of the present disclosure. With reference to FIG. 4, each bank 60 includes a sense amplifier 70, an address buffer 75, a row decoder 80, an input/output (I/O) buffer 85, a column decoder 90 and a memory array 100. Address signals are received by the address buffer 75 and decoded by the row decoder 80 and the column decoder 90 to access the memory array 100. Data can be read from the memory array 100 by sensing voltage and/or current changes on the data lines using the sense amplifier 70. The sense amplifier 70 can read and latch a page (e.g., a row) of data from the memory array 100. More particularly, the sense amplifier 70 is electrically connected to the memory array 100 through a plurality of bit lines BL. Typically, when data stored in the memory array 100 is to be output, the data is loaded on the bit lines BL and amplified by the sense amplifier 70. Next, the data on the bit lines BL is transferred to the I/O buffer 85. The data on the I/O buffer 85 is transferable via data pads 138 (shown in FIG. 3) to an external device. When data is to be inputted, the data input path is in the reverse order of the data output path described above. The bank 60 can further include a clock generator 95 electrically connected to the sense amplifier 70, the address buffer 75, the row decoder 80, the I/O buffer 85, and the column decoder 90. The clock generator

95 is an electronic circuit that produces a clock signal for use in synchronizing operations in the DRAM.

Figure 5:
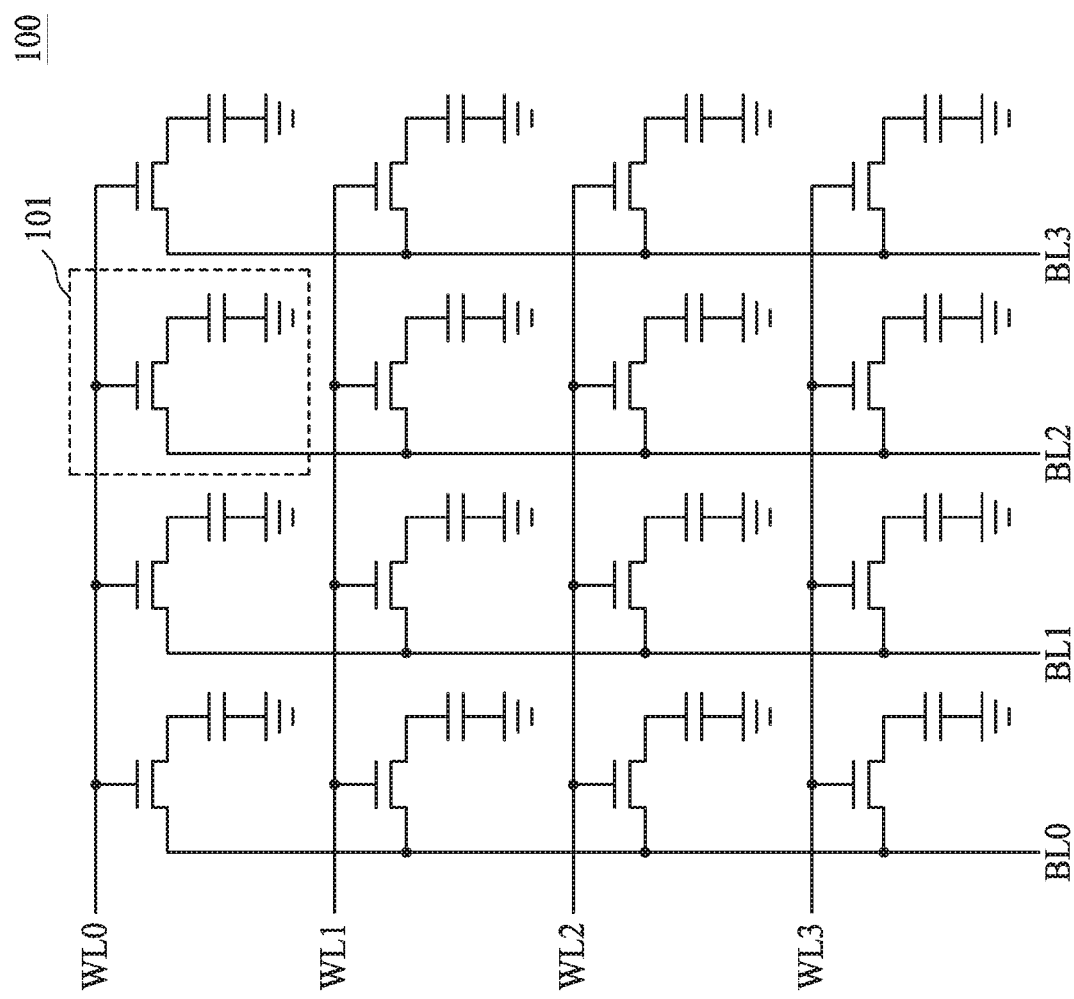
FIG. 5 is a circuit diagram of a memory array, in accordance with some embodiments of the present disclosure.

FIG. 5 is a circuit diagram of the memory array 100, in accordance with some embodiments of the present disclosure. With reference to FIG. 5, the memory array 100 includes multiple memory cells 101 laid out in a rectangular matrix. Each row of memory cells 101 are connected by a word line and each column of memory cells 101 are connected by a bit line. In FIG. 5, sixteen memory cells 101 are organized and accessed via word lines WL0 to WL3 and bit lines BL0 to BL3.

Figure 6:
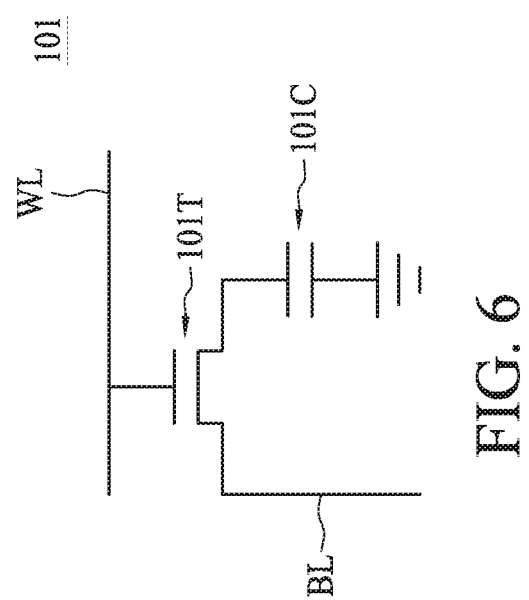
FIG. 6 is a close-up view of FIG. 5, in accordance with some embodiments of the present disclosure.

FIG. 6 is a close-up view of FIG. 5. With reference to FIG. 6, the memory cell 101 consists of an access transistor 101T and a storage capacitor 101C electrically connected to the access transistor 101T. Specifically, the access transistor 101T is generally an NMOS transistor, which is used to control the channel to the memory cell 101 by opening or closing the gate of the access transistor 101T. The storage capacitor 101C is used to store information according to the state of electrical charges stored therein. The storage capacitor 101C in an empty state, that is, no charge, is denoted a logic value of 0. The storage capacitor 101C in a fully-charged state is denoted a logic value of 1. The memory cell 101 stores a bit of data by means of the two extreme states of charges stored in the storage capacitor 101C. With reference to FIG. 6 again, a word line WL connected to the access transistor 101T is used to control the gate of the access transistor 101T by applying a voltage to the access transistor 101T. A bit line BL is arranged perpendicular to the word line WL and is also connected to the access transistor 101T. When the gate of the access transistor 101T is turned on, the access transistor 101T connects the storage capacitor 101C to the bit line BL such that the logic value stored in the storage capacitor 101C will be placed on the bit line BL. However, the amount of electrical charge stored in the storage capacitor 101C is typically very small, and as a result the difference between the empty state and the fully-charged stage is also very small. When the transistor 101T is activated, the charge in the storage capacitor 101C is shared with the bit line BL. The capacitance of the bit line BL is much greater than that of the storage capacitor 101C. Therefore, the change in voltage of the bit line BL is tiny, and there is a need to resolve the exact state in the storage capacitor 101C.

Figure 7:
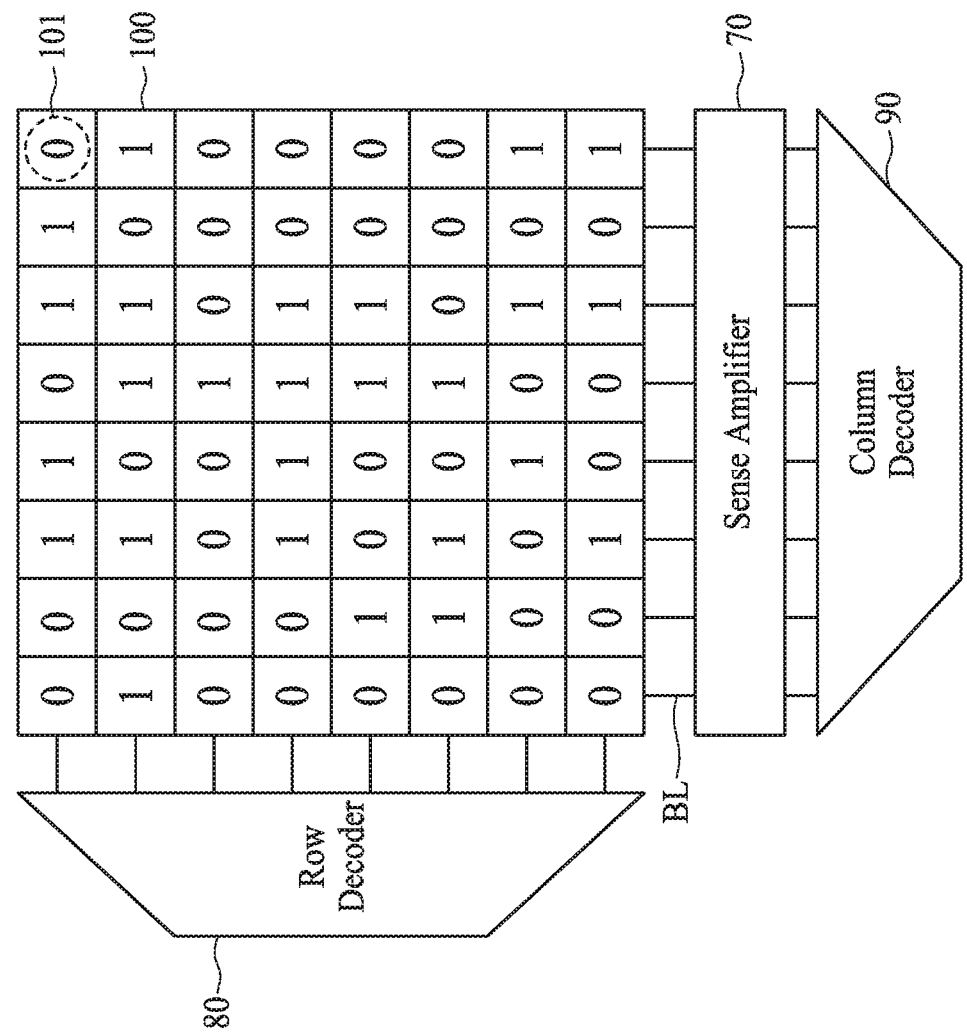
FIG. 7 is a schematic diagram showing the memory array with resolved logic values in all memory cells, in accordance with some embodiments of the present disclosure.

FIG. 7 is a schematic diagram showing the memory array 100 with resolved logic values in all memory cells 101, in accordance with some embodiments of the present disclosure. With reference to FIG. 7, the signals provided from the column decoder 90 are transmitted to the sense amplifier 70, and eventually to the memory array 100, wherein the sense amplifier 70 is coupled to each column of cells 101 through the bit lines BL. The sense amplifier 70 is used to sense the small voltage and/or current change from the bit lines BL that represents a data bit (1 or 0) stored in the memory cell 101, and then to amplify the small voltage to a recognizable logic level so that the data can be correctly interpreted.

Figure 8:
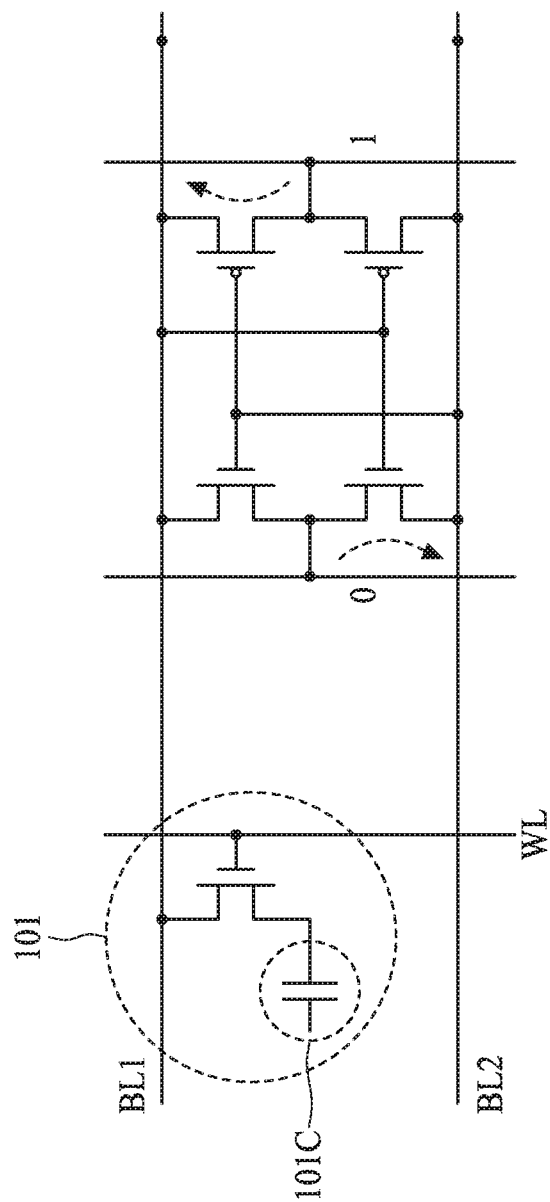
FIG. 8 is a schematic diagram showing the operation principle of a sense amplifier, in accordance with some embodiments of the present disclosure.

FIG. 8 is a schematic diagram showing the operation principle of the sense amplifier 70, in accordance with some embodiments of the present disclosure. During operation, the sense amplifier 70 is connected to an adjacent pair of bit lines BL1 and BL2. The sense amplifier 70 pulls up the small voltage difference between bit line BL1 and bit line BL2 of a particular column and amplifies the signal stored in the storage capacitor 101C. Therefore, whether the data stored in the storage capacitor 101C is 0 or 1 can be determined by the sense amplifier 70. Another function of the sense amplifier 70 is that it also acts as a temporary data storage element. For example, after data values contained in the cells 101 are sensed and amplified, the sense amplifier 70 will continue to drive the sensed data values until the memory array 100 is precharged and ready for another access. In this manner, data in the cells 101 in the same row can be accessed from the sense amplifier 70 without repeated row accesses to the cells 101 themselves. Therefore, the sense amplifier 70 effectively acts as a row buffer that holds an entire row of data. As a result, an array of the sense amplifier 70 is also referred to as a row buffer.

Figure 9:
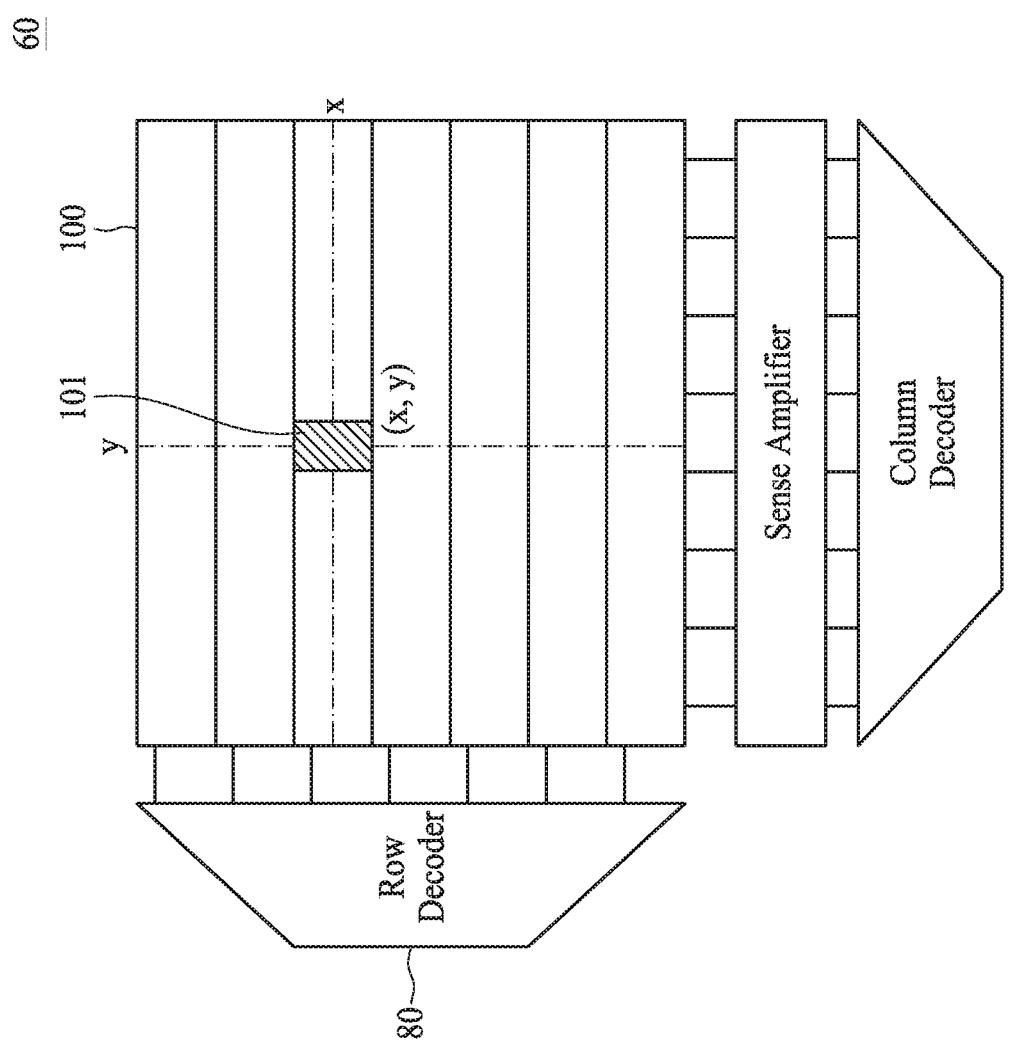
FIG. 9 is a schematic diagram showing the process of a specific address being selected within a bank, in accordance with some embodiments of the present disclosure.

FIG. 9 is a schematic diagram showing the process of a specific address being selected within the bank 60, in accordance with some embodiments of the present disclosure. With reference to FIG. 9, in order to store data and read data from the memory array 100, the row and column address associated with the data must be provided. A memory address (x, y) applied to a memory array 100 is broken into a row address x and a column address y, which are respectively processed by a row decoder 80 and column decoder 90. The row decoder 80 and the column decoder 90 are used to select a particular memory location in the array, based on the binary row and column addresses. The row address x and the column address y are selected in order. Specifically, the row address selection is processed before the column address selection. After the row decoder 80 selects a desired row, data stored in the selected cells 101 in the selected row are transferred to the sense amplifier 50. Subsequently, after selecting a desired column using the column address y, the exact intersection (x, y) within the array is ascertained. At such intersection, a capacitor stores a charge, which represents the data being accessed.

Figure 10:
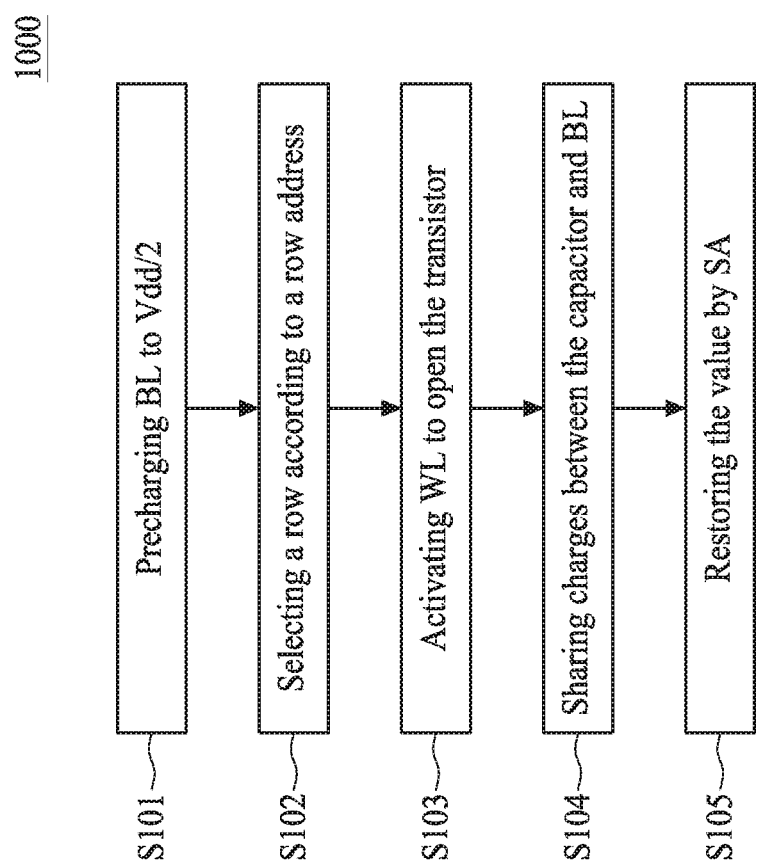
FIG. 10 is a flow diagram showing a method describing a read operation of a DRAM, in accordance with some embodiments of the present disclosure.

FIG. 10 is a flow diagram showing an operation 1000 describing a read operation of a DRAM, in accordance with some embodiments of the present disclosure. With reference to step S101 of the operation 1000 in FIG. 10, first, bit lines are precharged to identical voltages that are between high and low logic levels (½ Vdd). For example, the bit lines are precharged to 0.5 V (if the low logic level is 0 V and the high logic level is 1 V). Subsequently, in step S102, one of the rows is selected according to the row address obtained by a row decoder. In step S103, after the desired row is ascertained, a word line of the selected row is driven to the high logic level by applying a voltage thereto, thereby turning on the access transistor. This causes the access transistor to be conductive, and the storage capacitor is therefore connected to the bit line through the access transistor. In step S104, if the stored value is 1, then a charge is transferred from the storage capacitor to the bit line connected thereto; if the stored value is 0, then a charge is transferred from the connected bit line to the storage capacitor. In step S105, sense amplifiers compare the voltage to a threshold to determine whether the voltage represents logic 1 or logic 0. The read process in the DRAM is destructive because it removes the charge stored in the memory cells in an entire row. The sense amplifier on a chip needs to rewrite the data to the accessed row before sending the bit from a single column to output.

In a typical write operation of DRAM, the row address is ascertained, as in a read operation. Next, a voltage is applied to the bit line and will be transferred to the capacitor and be stored therein. Subsequently, the data will be provided to the sense amplifier and the column decoder. Finally, the data will be provided to the cells that are on the previously-selected word line. The old data is replaced by the new data. In summary, the write operation decodes the address in a manner similar to that of the read operation.

Data is stored in the storage capacitor as electrical charges, but the electrical charges leak over time. Due to the tendency of a storage capacitor to lose its charge over time, memory cells need to be periodically refreshed in order to maintain the value stored in the capacitor. Each memory cell is refreshed periodically, at a refresh interval specified by the DRAM standards. The exact refresh interval depends on the DRAM type (e.g., DDR) and the operating temperature. The DRAM cannot be accessed while it is being refreshed.

As the DRAM sizes decrease, the manufacturing and packaging of the memory cells becomes more difficult and prone to defects. The defects generally come from the manufacturing environment and may cause the memory cells to run abnormally, causing device errors and/or failures. The memory device may have defective cells, defective rows or defective columns. In some cases, memory cells are normal before the memory device is packaged. In some cases, failures can occur after the memory device is packaged. In still other cases, some failures are detected only after the memory device has been packaged. Examples of package types include epoxy encapsulation, ceramic packages, metal or glass packages, and the like. In most situations, after a memory device has been packaged, it is only accessible through, for example, the pins of the package to the memory device. Therefore, if the packaged memory device is found to contain defective memory cells during testing, it is impossible to physically replace the defective memory cells. In order to improve the overall yield and reduce cost, it is desirable to be able to repair a memory device after it is packaged.

Figure 11:
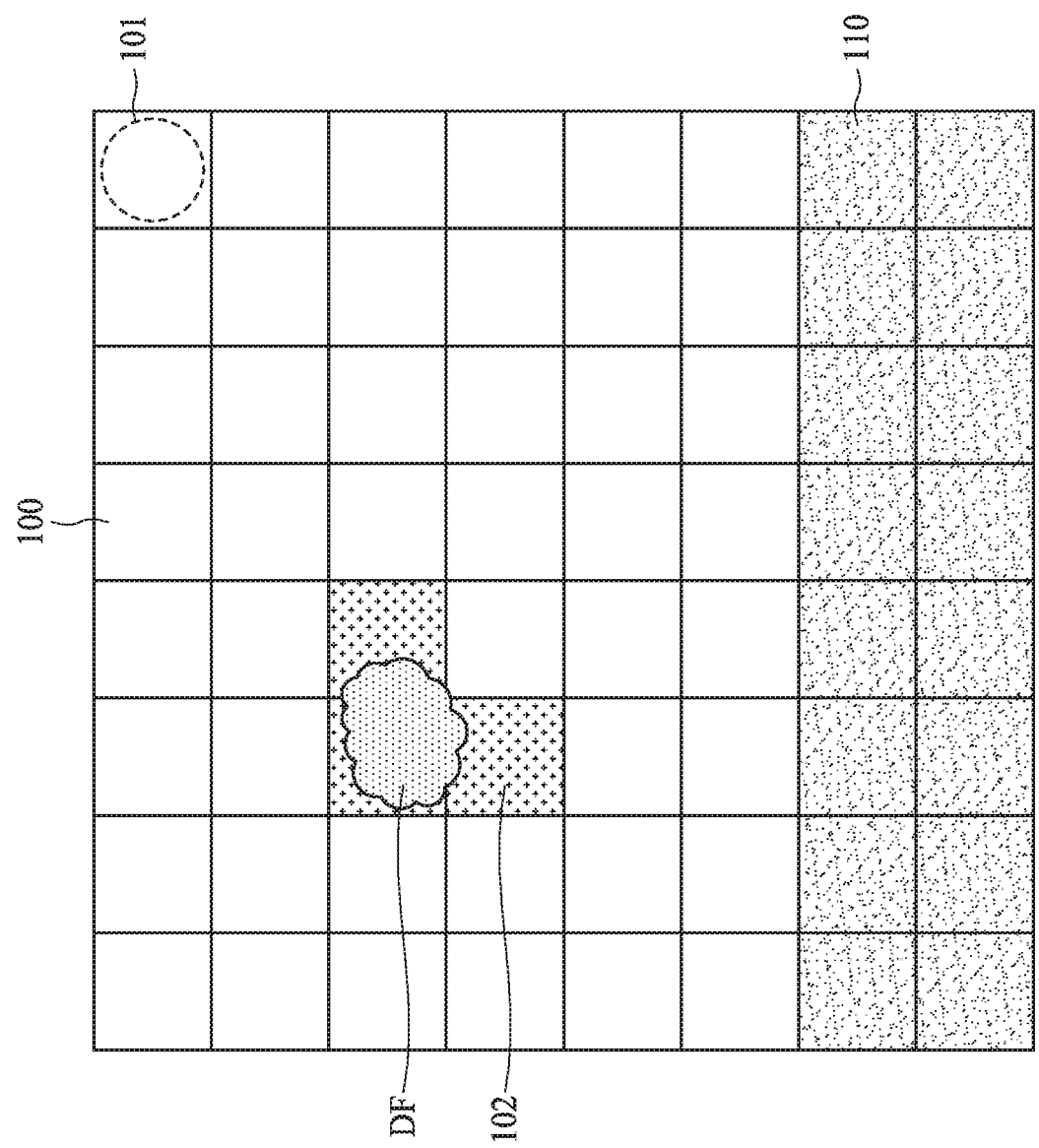
FIG. 11 is a schematic diagram showing a memory array suffering from at least one defect, in accordance with some embodiments of the present disclosure.

FIG. 11 is a schematic diagram showing a memory array 100 suffering from at least one defect, in accordance with some embodiments of the present disclosure. With reference to FIG. 11, a defect DF in the memory array 100. The defect DF may influence operations of some of the memory cells 101. Those memory cells 101 which cannot operate normally are referred to as defective memory cells 102. To solve the problem that the defect DF is found after the memory device has been packaged, manufacturers of memory modules include redundant units 110 adjacent to the memory array 100 in order to replace the defective memory cells 102, thereby extending the lifetime of a memory device. Each of the redundant unit 110 may include, for example, redundant rows or redundant columns. With redundant units 110, the memory device can still be effective without a need to disassemble it. In order to avoid defects affecting the memory production yield, redundant units 110 are a commonly used technology.

In fourth-generation-double-data-rate (DDR4) SDRAM devices, a technology called post package repair (PPR) is introduced. PPR enables a memory device to be repaired after it is packaged. In JEDEC standards of DDR4, almost all mainstream memory manufacturers support PPR functionality. PPR has the ability to track the availability of resources. The DRAM device confirms the availability of PPR resources in each memory bank at startup. The memory device can be tested to identify defective units. For example, the defective units may include defective cells, defective rows or defective columns. The principle of PPR is to replace a defective unit with a redundant unit after a memory device has been packaged. PPR functions can provide improved reliability and availability by using redundant memory cells, generally arranged as a number of redundant rows per bank in a DRAM device.

Figure 12:
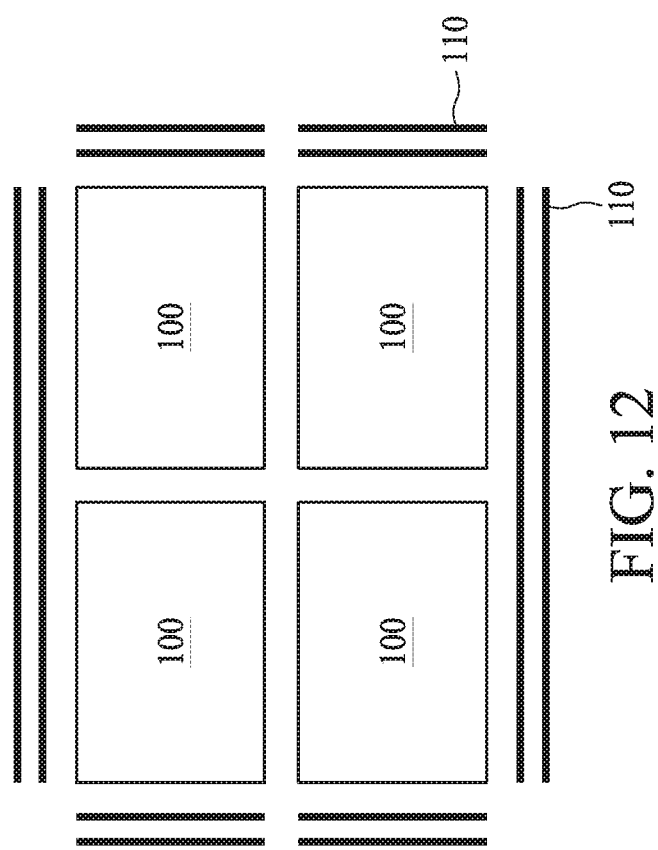
FIG. 12 is a schematic diagram showing an arrangement of redundant units, in accordance with some embodiments of the present disclosure.

FIG. 12 is a schematic diagram showing an arrangement of redundant units 110, in accordance with some embodiments of the present disclosure. With reference to FIG. 12, four memory arrays 100 are organized. In some embodiments, the memory arrays 100 are arranged in a matrix configuration, and the redundant units 110 are located at a periphery of the memory arrays 100. In an embodiment, two redundant units 110 are arranged side by side. In an embodiment, a pair of redundant units 110 is located beside the memory array 100. In an embodiment, a pair of redundant units 110 is located beside two memory arrays 100.

Furthermore, PPR also supports hard (HPPR) and soft (SPPR) modes, which respectively correspond to permanent and temporary repairs. HPPR is non-volatile; however, SPPR is volatile, which means that the repair will be cleared after the power of the device is reset. SPPR can refer to a non-persistent but real-time method of PPR. During the lifetime of a chip, the internal storage is continuously aging and storage problems may arise. When such problems arise, it is preferable that the storage can be repaired automatically such as with the SPPR function. With SPPR, the address data of the defective unit, such as a defective row, can be stored in a memory device after the memory device is packaged. The SPPR function can repair the defective row according to its address, which was identified as defective after the memory device was packaged. In addition to the defective row, JEDEC standards require that some particular rows in a memory bank of a DDR4 SDRAM, referred to as associated rows, must be backed up before an SPPR functions to repair the defective row.

Figure 13:
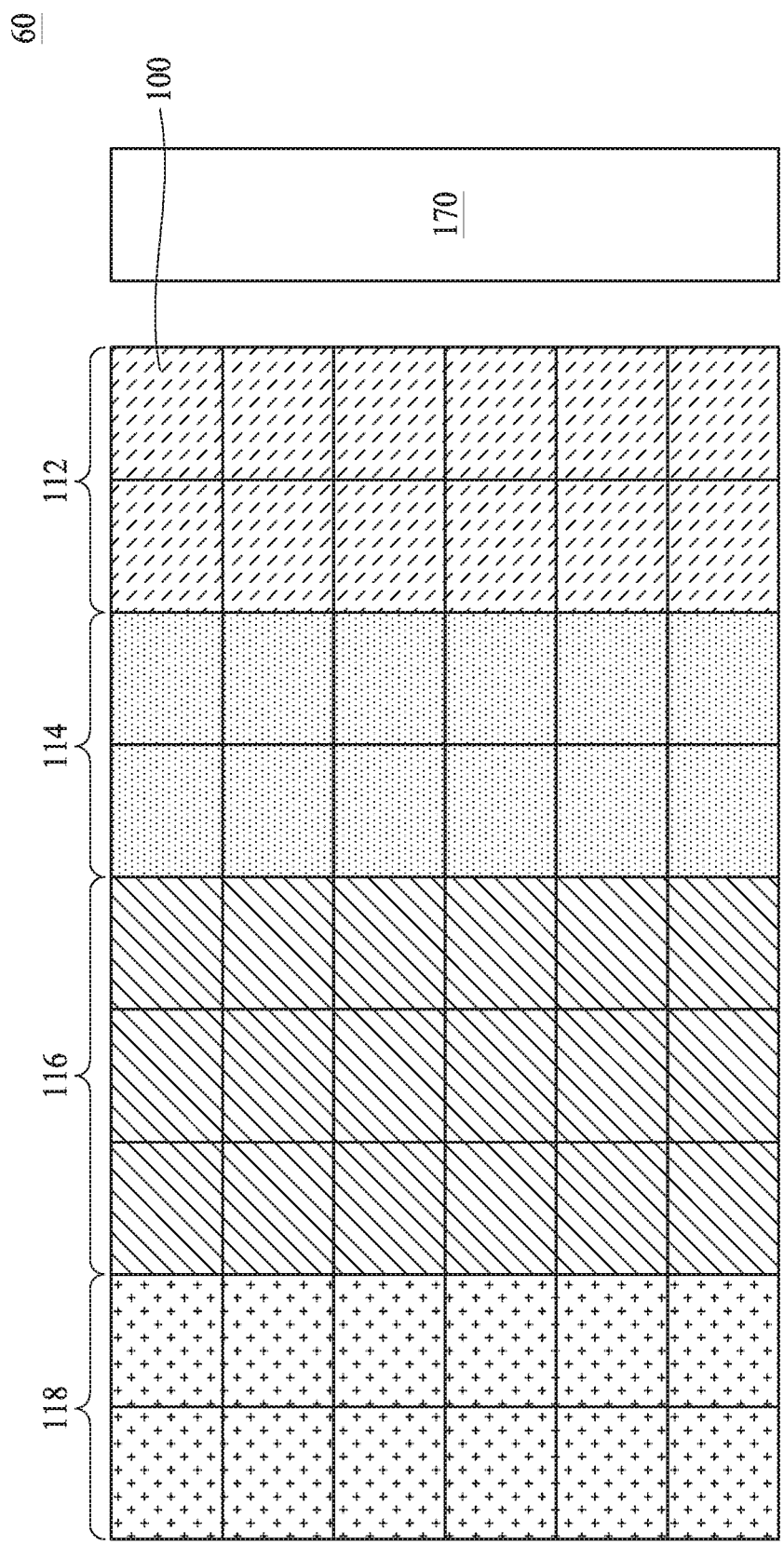
FIG. 13 is a schematic view of the bank in FIG. 2, in accordance with some embodiments of the present disclosure.

FIG. 13 is a schematic view of the bank 60 in FIG. 2, in accordance with some embodiments of the present disclosure. With reference to FIG. 2 and FIG. 13, the memory array 100 at least comprises normal rows 112, defective rows 114, associated rows 116 and redundant rows 118. The defective rows 114 are rows that may contain defects which will lead to device errors and/or failures. The associated rows 116 are related to the defective rows 114 according to JEDEC standards. The redundant rows 118 are spare rows that are designed by the manufacturer to replace one or more of the defective rows 114 in the memory array 100.

Figure 14:
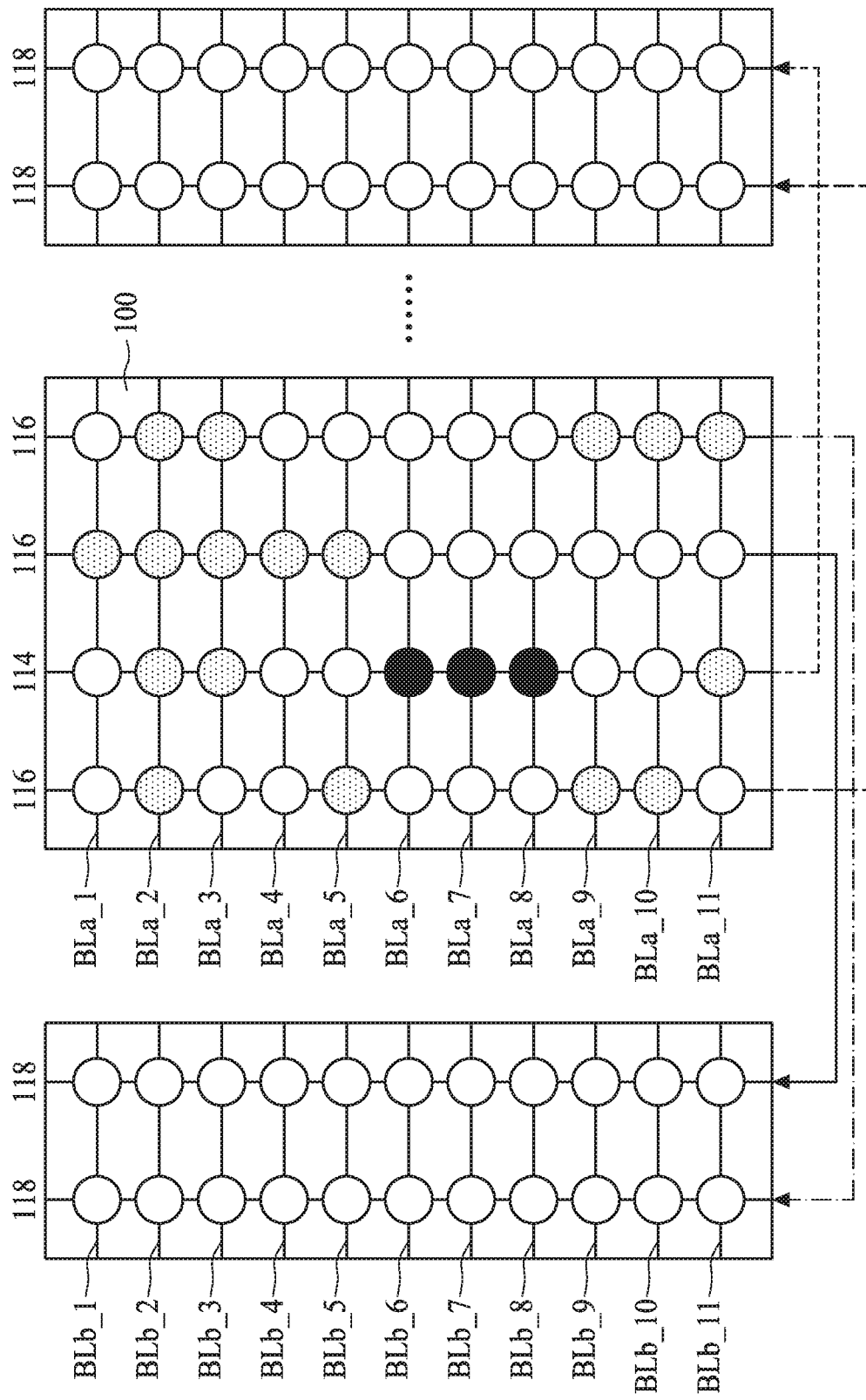
FIG. 14 is a schematic DRAM array diagram showing an associated row backup process in an SPPR function, in accordance with a comparative embodiment.

FIG. 14 is a schematic DRAM array diagram showing an associated row backup process in an SPPR function, in accordance with a comparative embodiment. With reference to FIG. 14, redundant rows 118 are discrete from the memory array 100 and are not dedicated to the memory array 100. Instead, the redundant rows 118 are to be allocated whenever there is a need to perform an SPPR function. In the comparative embodiment, there are three associated rows 116 and one defective row 114, as shown in FIG. 14. Each associated row 116 is connected to bit lines BLa_1 to BLa_11, and each redundant row 118 is connected to bit lines BLb_1 to BLb_11 different from the bit lines BLa_1 to BLa_11. After the defective row 114 that includes defective memory cells (marked as black circles in FIG. 14) in the memory array 100 is detected, the associated rows 116 will be backed up automatically before an SPPR function is performed. During the SPPR sequence, all the data in the associated rows 116 needs to be rewritten to the discrete redundant rows 118. First, the original data in the associated rows 116 needs to be obtained; that is, a read operation is required to read all the data thereof. Subsequently, the data of the associated rows 116 is rewritten to the discrete redundant rows 118.

Figure 15:
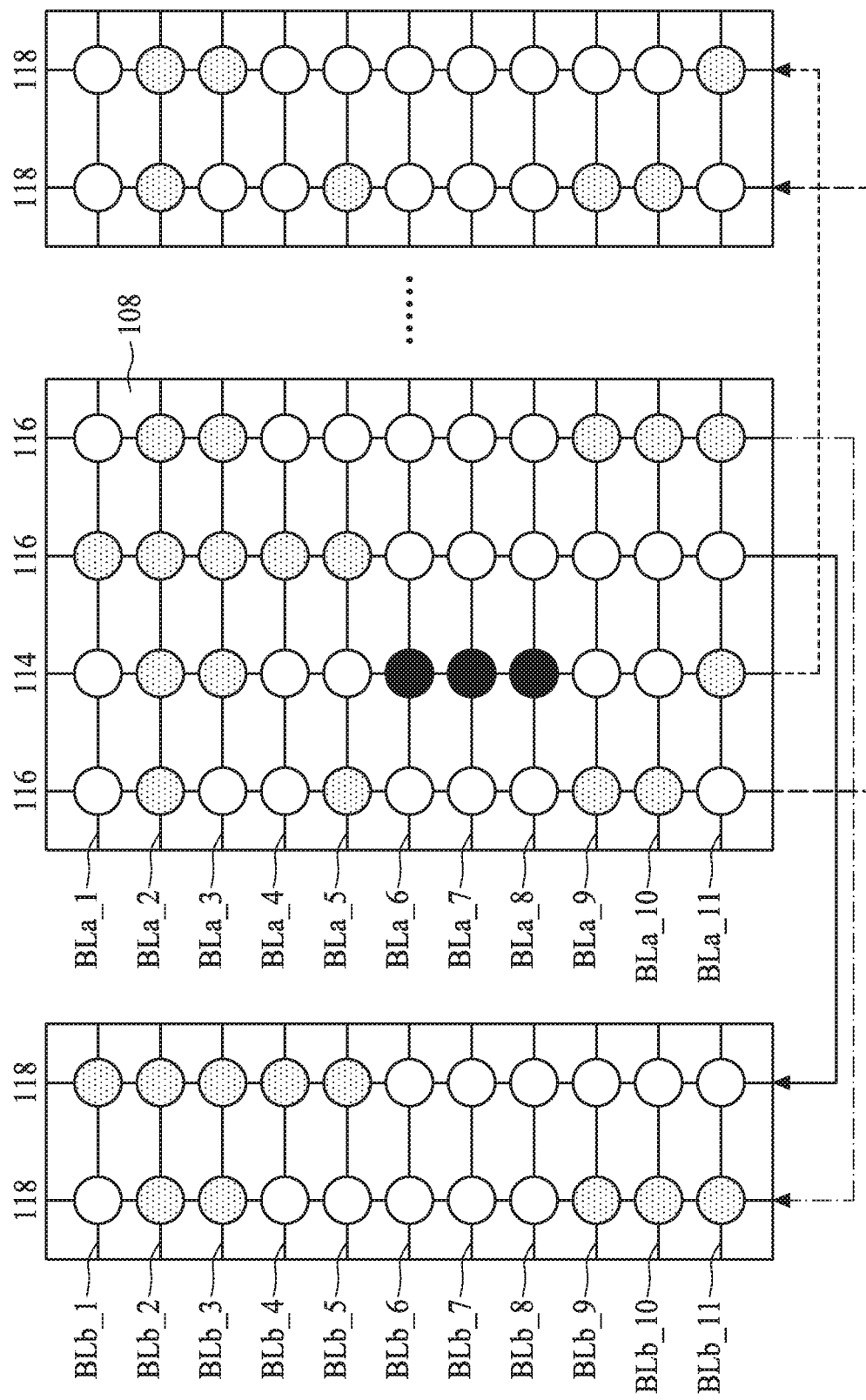
FIG. 15 is a schematic DRAM array diagram showing a completion of the backup of the associated rows in FIG. 14, in accordance with the comparative embodiment.

FIG. 15 is a schematic DRAM array diagram showing a completion of the backup of the associated rows in FIG. 14, in accordance with the comparative embodiment. With reference to FIG. 14 and FIG. 15, the spaced redundant rows 118 shown in FIG. 15 contain data from the associated rows 116. As a result, at such time, the redundant rows 118 have the same data as the associated rows 116. Due to the need to rewrite all the data from the associated rows 116 to the redundant rows 118, the associated row backup process in a post package repair process in the comparative embodiment is time-consuming.

Figure 16:
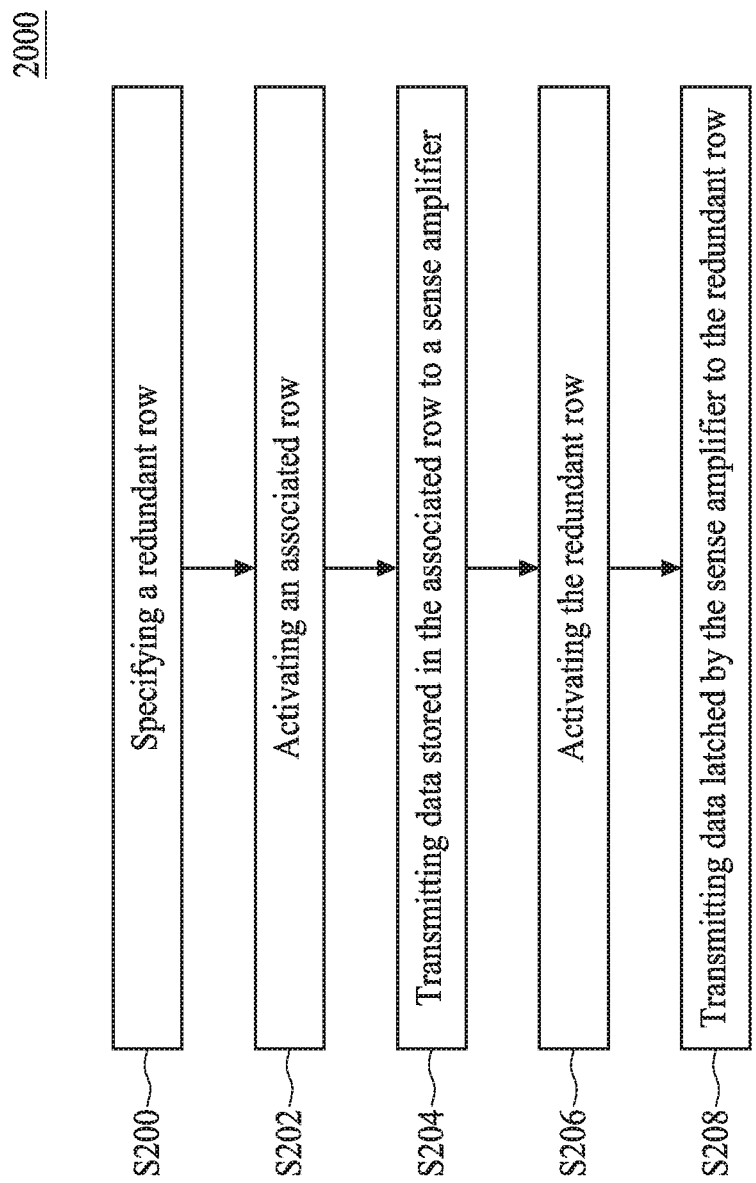
FIG. 16 is a flow diagram showing an operation 2000 describing an associated row backup process in an SPPR function, in accordance with an embodiment of the present disclosure.

FIG. 16 is a flow diagram showing an operation 2000 of an associated row backup process in a soft post package repair function, in accordance with an embodiment of the present disclosure. The operation 2000 comprises a step S200 of specifying a redundant row; a step S202 of activating an associated row; a step S204 of transmitting data stored in the associated row to a sense amplifier; a step S206 of activating the redundant row; and a step S208 of transmitting the data latched by the sense amplifier to the redundant row.

Figure 17:
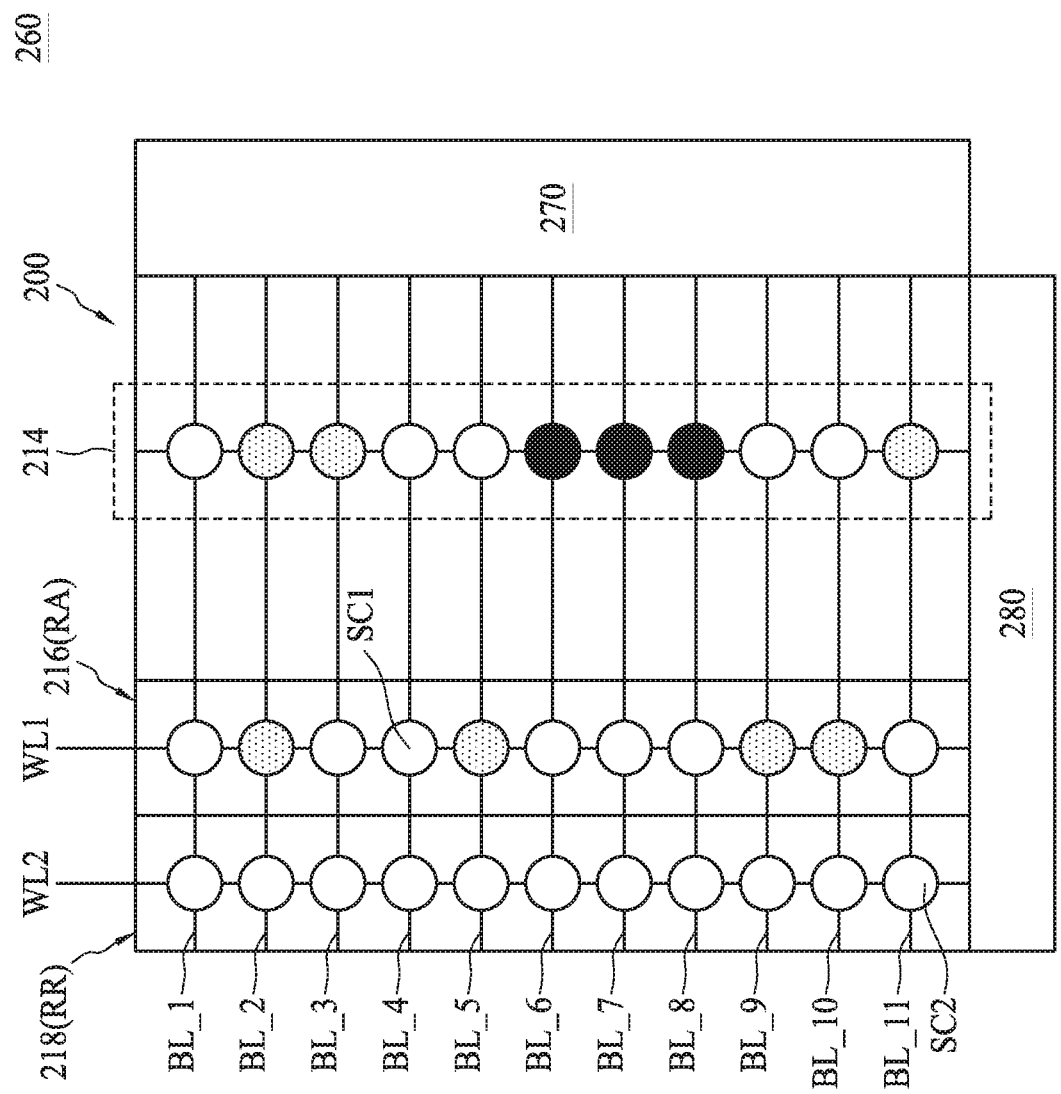
FIG. 17 to FIG. 19 are schematic DRAM array diagrams showing each stage of the method, in accordance with an embodiment of the present disclosure.
Figure 18:
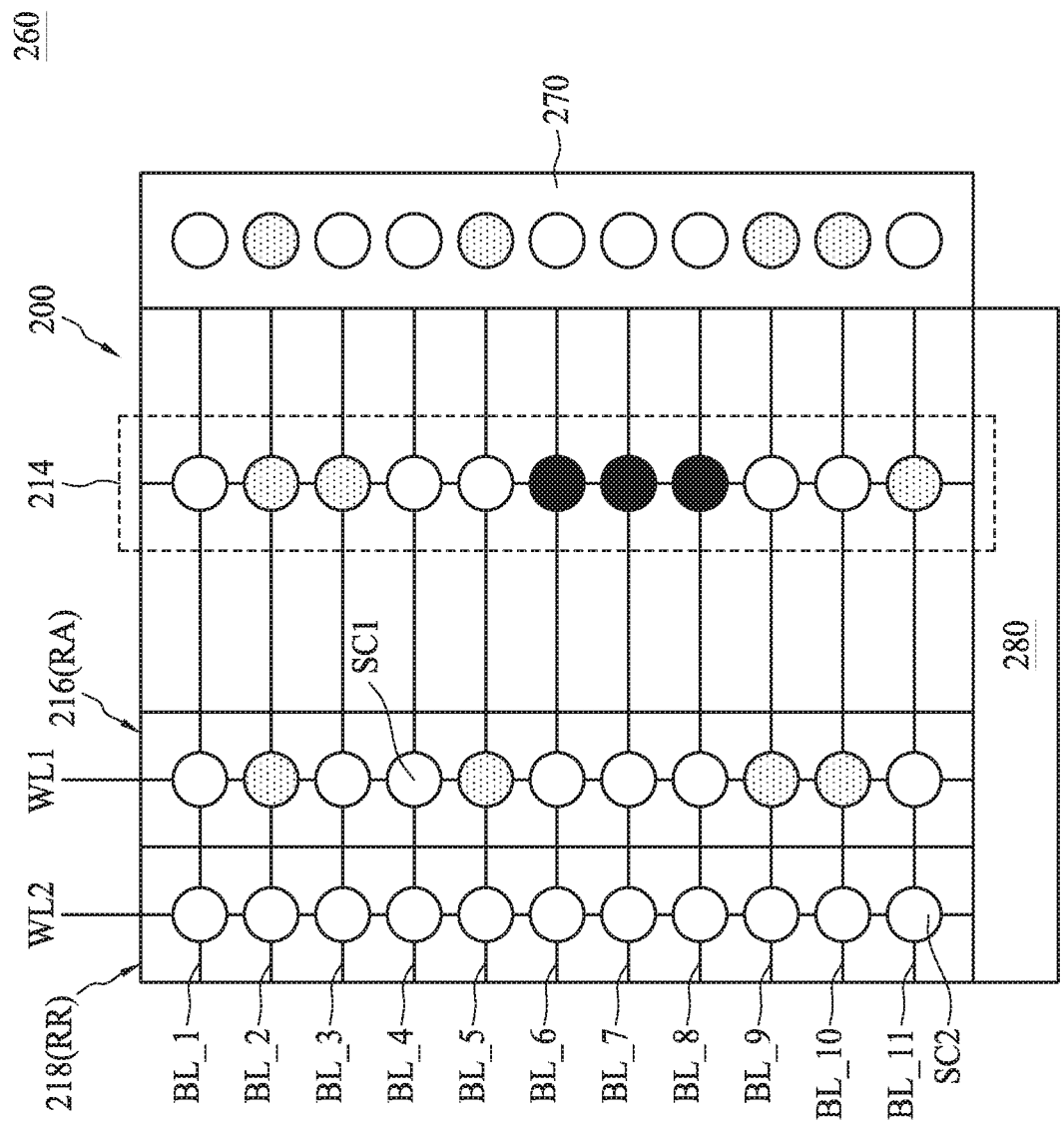
Figure 19:
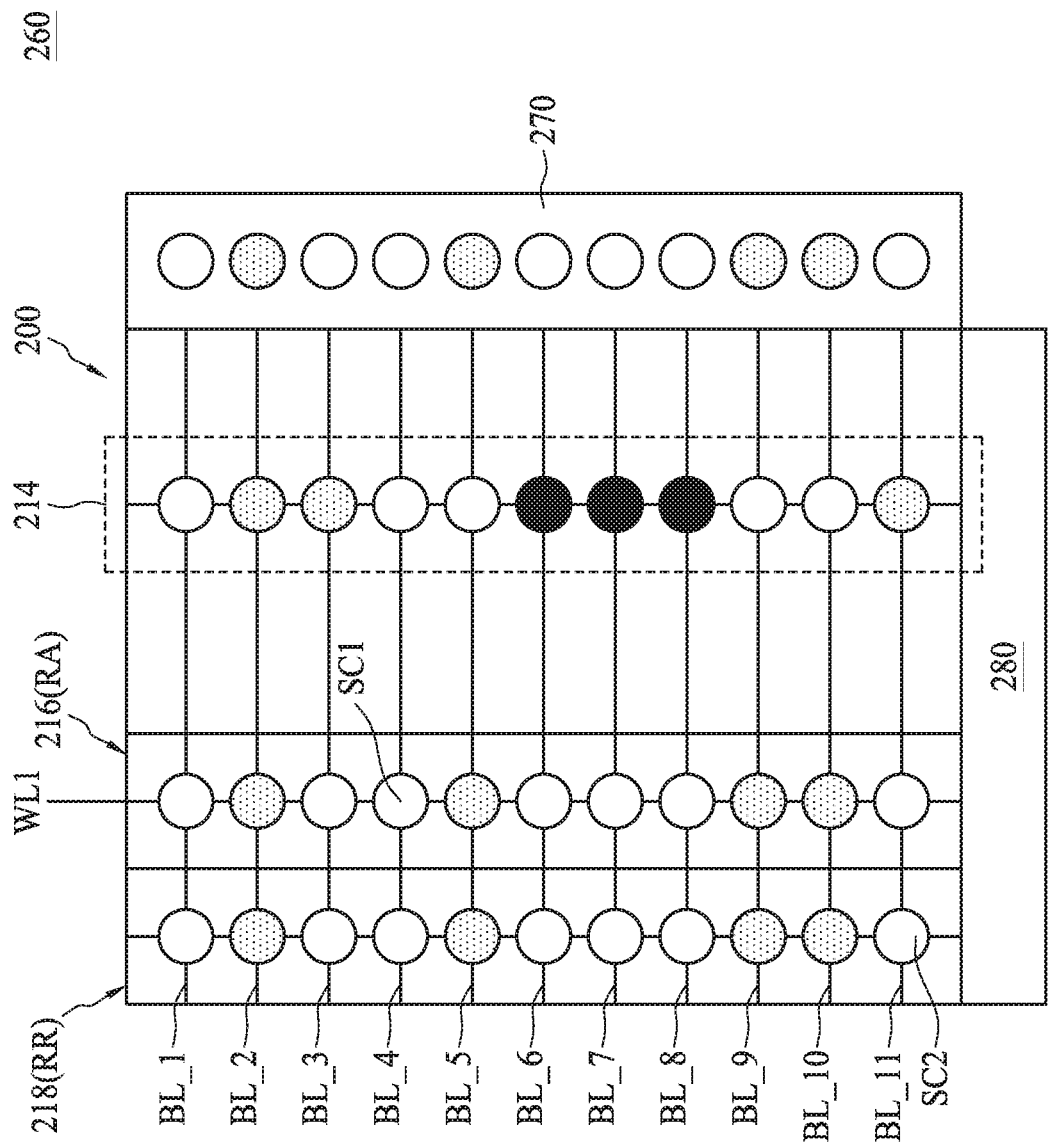

The following describes an exemplary process flow of the operation 2000 in accordance with some embodiments of the present disclosure. FIG. 17 to FIG. 19 are schematic diagrams of a DRAM illustrating stages of the operation 2000, in accordance with an embodiment of the present disclosure. With reference to FIG. 17, a bank 260 at least comprises a memory array 200, a sense amplifier 270 adjacent to the memory array 200 and a row decoder 280 adjacent to the memory array 200. In an embodiment, the sense amplifier 270 is electrically connected to the memory array 200. In an embodiment, the row decoder 280 is electrically connected to the memory array 200. In an embodiment, the memory array 200 may comprise at least one defective row 214 and at least one associated row 216. The at least one defective row 214 and the at least one associated row 216 are electrically connected to the sense amplifier 270 by a plurality of bit lines BL_1 to BL_11. Specifically, the at least one associated row 216 comprises a plurality of associated memory cells SC1 connected by an associated word line WL1. According to JEDEC standards, at least one associated row is associated with a defective row, and data in the at least one associated row needs to be backed up before a post package repair is performed. In some embodiments, the at least one defective row 214 may be deactivated in the beginning of a post package repair procedure.

The operation 2000 can begin in step S200, wherein a redundant row 218 is specified to be arranged adjacent to the memory array 200. In an embodiment, the redundant row 218 is arranged adjacent to the at least one associated row 216. The redundant row 218 is electrically connected to the sense amplifier 270. Specifically, the redundant row 218 comprises a plurality of redundant memory cells SC2 connected by a redundant word line WL2. The redundant memory cells SC2 are electrically connected to the associated memory cells SC1 through a plurality of bit lines BL_1 to BL_11, and further electrically connected to the sense amplifier 270.

In step S202, a particular associated row 216 is activated. Specifically, the row decoder 280 is responsive to an associated row address RA in the step of activating the particular associated row 216.

In step S204, after the associated row 216 is activated, data in the associated row 216 is transmitted to the sense amplifier 270 through the plurality of bit lines BL_1 to BL_11. The sense amplifier 270 senses and amplifies the data transmitted from the associated row 216. At such time, the sense amplifier 270 temporarily latches the data that was previously stored in the associated row 216.

In step S206, a redundant row 218 is activated. Specifically, the row decoder 280 is responsive to a redundant row address RR in the step of activating the redundant row 218.

In step S208, after the redundant row 218 is activated, data stored in the sense amplifier 270 is transmitted to the redundant row 218 through the plurality of bit lines BL_1 to BL_11. When the backup process is completed, data in the redundant row 218 is identical to data in the associated row 216, as shown in FIG. 19. In some embodiments, the operation 2000 further comprises determining whether the memory device is to enter a repair mode in response to receiving one or more PPR commands from a memory controller.

In an embodiment of the present disclosure, it is not necessary to know the address information of the associated row 216 from a CPU because no read operation is performed on the associated row 216. Therefore, when performing a post package repair function, data in the associated row 216 does not need to be rewritten to the redundant row 218. Instead, data in the associated row 216 can be directly copied to the redundant row 218 because each of the associated memory cells SC1 and each of the redundant memory cells SC2 are connected to the sense amplifier 270 through the same bit line such as the bit line BL_1. After the sense amplifier 270 resolves the data contained in the associated memory cells SC1 in the associated row 216, the data is already stored in the sense amplifier 270 and can be directly transmitted to the redundant memory cells SC2 in the redundant row 218.

One aspect of the present disclosure provides a method for operating a post package repair function of a memory device. The method comprises: providing a memory bank, which comprises a memory array and a sense amplifier adjacent to the memory array, wherein the memory array comprises at least one defective row and at least one associated row, and the at least one associated row is electrically connected to the sense amplifier by a plurality of bit lines; arranging a redundant row adjacent to the memory array, wherein the redundant row is electrically connected to the sense amplifier by the plurality of bit lines; activating the at least one associated row to transmit data in the at least one associated row to the sense amplifier; latching the data in the sense amplifier; activating the redundant row; and transmitting the data from the sense amplifier to the redundant row.

Another aspect of the present disclosure provides a memory device related to the operation method in a post package repair function. The memory device comprises a memory array, which comprises at least one associated row and at least one defective row; a sense amplifier, wherein the at least one associated row is electrically connected to the sense amplifier by a plurality of bit lines; and a redundant row electrically connected to the sense amplifier by the plurality of bit lines.

According to JEDEC standards, associated rows in a DDR4 SDRAM need to be backed up before a soft post package repair (SPPR) is performed. In an embodiment of the present disclosure, the operation of rewriting all the data in the associated row to the redundant row is eliminated, thereby increasing the backup efficiency of the data in the associated row.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for operating a post package repair function of a memory device, comprising steps of:
    providing a memory bank comprising a memory array and a sense amplifier adjacent to the memory array, wherein the memory array comprises at least one defective row and at least one associated row, the at least one associated row being electrically connected to the sense amplifier by a plurality of bit lines;
    arranging a redundant row adjacent to the memory array, wherein the redundant row is electrically connected to the sense amplifier by the plurality of bit lines;
    activating the at least one associated row to transmit data in the at least one associated row to the sense amplifier;
    latching the data in the sense amplifier;
    activating the redundant row; and
    transmitting the data from the sense amplifier to the redundant row.

2. The method of claim 1, wherein the at least one associated row is associated with the at least one defective row according to JEDEC standards.

3. The method of claim 1, further comprising: arranging a row decoder adjacent to the memory array, wherein the row decoder is responsive to an associated row address in the step of activating the at least one associated row.

4. The method of claim 3, wherein the row decoder is responsive to a redundant row address in the step of activating the redundant row.

5. The method of claim 1, wherein the at least one associated row comprises multiple associated memory cells connected by an associated word line.

6. The method of claim 5, wherein the redundant row comprises multiple redundant memory cells connected by a redundant word line.

7. The method of claim 1, wherein the memory device comprises a double-data-rate fourth generation synchronous dynamic random access memory (DDR4 SDRAM) module.

8. The method of claim 7, wherein the memory device further comprises a post package repair (PPR) module.

9. The method of claim 1, wherein before activating the at least one associated row, the at least one defective row is deactivated.

10. The method of claim 1, wherein after transmitting the data from the sense amplifier to the redundant row, the data in the redundant row is identical to the data in the at least one associated row.

11. The method of claim 1, further comprising: determining whether the memory device is to enter a repair mode in response to receiving one or more post package repair (PPR) commands from a memory controller.

12. A memory device, comprising:
    a memory array comprising at least one associated row and at least one defective row;
    a sense amplifier, wherein the at least one associated row is electrically connected to the sense amplifier by a plurality of bit lines; and
    a redundant row electrically connected to the sense amplifier by the plurality of bit lines;
    wherein data in the redundant row is identical to data in the at least one associated row.

13. The memory device of claim 12, wherein the at least one associated row is associated with the at least one defective row according to JEDEC standards.

14. The memory device of claim 12, further comprising:
    a row decoder, located adjacent to the memory array, wherein the row decoder is responsive to an associated row address.

15. The memory device of claim 14, wherein the row decoder is responsive to a redundant row address.

16. The memory device of claim 12, wherein the at least one associated row comprises multiple associated memory cells connected by an associated word line.

17. The memory device of claim 12, wherein the redundant row comprises multiple redundant memory cells connected by a redundant word line.

18. The memory device of claim 12, wherein the memory device comprises a double-data-rate fourth generation synchronous dynamic random access memory (DDR4 SDRAM) module.

19. The memory device of claim 12, wherein the memory device further comprises a post package repair (PPR) module.

* * * * *